United States Patent
Yamauchi et al.

[11] Patent Number: 5,428,309
[45] Date of Patent: Jun. 27, 1995

[54] DELAY CIRCUIT

[75] Inventors: Naoki Yamauchi; Hiroshi Kobayashi, both of Itami, Japan

[73] Assignee: Mitsubishi Denki Kabushiki Kaisha, Japan

[21] Appl. No.: 161,213

[22] Filed: Dec. 2, 1993

Related U.S. Application Data

[63] Continuation of Ser. No. 967,916, Oct. 28, 1992, abandoned, which is a continuation of Ser. No. 453,425, Dec. 19, 1989, abandoned.

[30] Foreign Application Priority Data

May 11, 1989 [JP] Japan ................... 1-117916

[51] Int. Cl.⁶ .................... H03L 7/06; H03H 11/26
[52] U.S. Cl. .................... 327/158; 327/262; 327/277; 327/156
[58] Field of Search ............... 307/591, 595, 603, 594, 307/602, 605, 606; 328/55; 375/118, 119; 331/1 A

[56] References Cited

U.S. PATENT DOCUMENTS

| | | | |
|---|---|---|---|
| 4,494,021 | 1/1985 | Bell | 307/591 |
| 4,496,861 | 1/1985 | Bazes | 307/602 |
| 4,504,749 | 3/1985 | Yoshida | 307/603 |
| 4,893,087 | 1/1990 | Davis | 331/1 A |
| 4,922,140 | 5/1990 | Gahle et al. | 307/594 |
| 4,922,141 | 5/1990 | Lofgren | 328/155 |
| 5,039,893 | 8/1991 | Tomisawa | 307/594 |

Primary Examiner—Timothy P. Callahan
Assistant Examiner—Toan Tran
Attorney, Agent, or Firm—Townsend And Townsend Khourie And Crew

[57] ABSTRACT

A delay circuit includes a semiconductor chip; a first inverter array formed on said semiconductor chip so as to have a number of first inverters so that it provides a number of delay signals; a second inverter array formed on the semiconductor ship so as to have second inverters, each having the same configuration as that of the first inverters, which are connected to form a ring counter; a phase locked lead-in unit for determining a phase difference between an oscillation output of the second inverter array and a basic clock and converting it into a voltage which is applied as power voltage to the first and second inverter arrays.

4 Claims, 6 Drawing Sheets

DELAY CIRCUIT

This is a continuation of application Ser. No. 07/967,916, filed Oct. 28, 1992, now abandoned, which is a continuation of application Ser. No. 07/453,425, filed Dec. 19, 1989, abandoned.

BACKGROUND OF THE INVENTION

This invention relates generally to delay circuits for delaying an input signal for a predetermined time and, more particularly, to a delay circuit which is stable against voltage and temperature changes.

A conventional delay circuit such as described in U.S. Pat. No. 4,496,861 is shown in FIG. 7. This delay circuit includes an oscillator 14 for generating a continuous clock signal A, a frequency divider 1 for shaping the clock signal A into a square wave basic clock signal 2, pulse generators 3–6 made of exclusive OR circuit, voltage controlled delay elements (VCD) 7–10, a sample hold circuit 11 for holding an output of the N-th pulse generator 6, and a low pass filter 12 for generating a control voltage 13 based on a signal from the sample hold circuit 11.

In operation, the basic clock signal 2 from the frequency divider 1 is delayed for a predetermined period of time by the first VCD 7 and made into a pulse $CP_0$ with the width equal to the delay by the first pulse generator 3. The delayed clock signal from the first VCD 7 is put into the second VCD 8 for a predetermined delay and made into a pulse $CP_1$ with the width equal to twice the delay time by the second pulse generator 4. Similarly, the third VCD 9 and the pulse generator 5 generate a pulse $CP_2$ with the width equal to three times the delay time. In this way, the N-th VCD 10 and the N-th pulse generator 6 generates a pulse $CP_N$ with the width equal to N times the delay time. This output pulse $CP_N$ is held by the sample hold circuit 11 and then converted by the low pass filter 12 into a voltage which is applied to the VCD 7–10 as a control voltage 13.

In the above delay circuit, however, the delay pulses $CP_0$–$CP_N$ are not generated unless a clock signal is supplied continuously. As a result, it has been impossible to provide a delayed output of a given pulse input.

FIG. 8 shows a delay circuit which is capable of providing a delay output of a given pulse input. This delay circuit includes buffers 21a–21n in the form of an emitter coupled logic (ECL), resistors 22a–22n, capacitors 23a–23n, output buffers 24a–24n, and a data selector 25 responsive to a selection signal 26 from a control unit (not shown) to select signals from the output buffer 24. The respective ECL buffers 21 are connected in series via each resistor 22. The respective output buffers 24 are connected between the respective ECL buffers 21 and the data selector 25. An end of each capacitor 23 is connected to an output of each resistor 22. The data selector 25 consists of a decoder 25a responsive to the selection signal 26 to output a signal at a predetermined signal line and a switching circuit 25b responsive to a signal from the decoder 25a to output a delayed signal from the output buffer 24.

In operation, a pulse signal B input to the ECL buffer 21a is put into an integration circuit consisting of the resistor 22a and the capacitor 23a. The output is applied to the next ECL buffer 21b with a delay determined by the time constant of the resistor 22a and the capacitor 23a. In general, the delay of the ECL buffers 21a–21n is smaller than the time constant so that the values of the resistor 22 and the capacitor 23 should be sufficiently precise to provide the delay time. The respective delay signals thus output from the ECL buffers 21a–21n via the output buffers 24a–24n are put into the data selector 25 to provide a delay signal C selected in response to a selection signal 26 which is set according to a desired delay time.

In order to set accurately a very short delay time, such as in order of nanoseconds, in the conventional delay circuit, it has been necessary to machine by laser trimming techniques the IC pattern of a finished semiconductor ship so as to adjust the respective values of the resistors 22 and capacitors 23 for providing an accurate CR time constant. In addition, since the ECL buffers 21 are used to control the delay output, it is necessary for ordinary logic circuits to provide another power source, such as a negative power source or level shifter, thus making the fabrication of an integrated circuit difficult.

FIG. 9 shows a simple circuit which consists of CMOS inverters 28a–28n in the form of a cascade connection to provide a delay time in nanoseconds. However, the CMOS inverters 28 varies with voltage and temperature changes, thus changing the delay time, so that it is necessary to provide a correction circuit. In addition, the characteristics of integrated circuits change from lot to lot in production, thus requiring troublesome adjustment of the finished products.

SUMMARY OF THE INVENTION

Accordingly, it is an object of the invention to provide a delay circuit with which it is easy to control a delay time with high accuracy.

It is another object of the invention to provide a delay circuit which is stable against voltage and temperature changes.

It is still another object of the invention to provide a delay circuit which requires no or little adjustment of the finished integrated circuit and thus is easy to be integrated.

In accordance with the invention there is provided a delay circuit which includes a semiconductor chip; a first inverter array formed on the semiconductor ship so as to have an odd number of first inverters connected in series so that it provides a delay signal at an output of each first inverter; a data selector for selecting a signal from the delay signals output at the first inverters; a second inverter array formed on the semiconductor ship so as to have second inverters, each having the same configuration as that of the first inverters, which are connected to form a ring counter; and a phase locked lead-in unit for determining a phase difference between a basic clock and an oscillation output of the second inverter array and converting it into a control voltage which is applied to the first and second inverter arrays.

The above and other object, features, and advantages of the invention will become more apparent from the following description when taken in conjunction with the accompanying drawings.

DESCRIPTION OF THE PREFERRED EMBODIMENT

Figure 1:
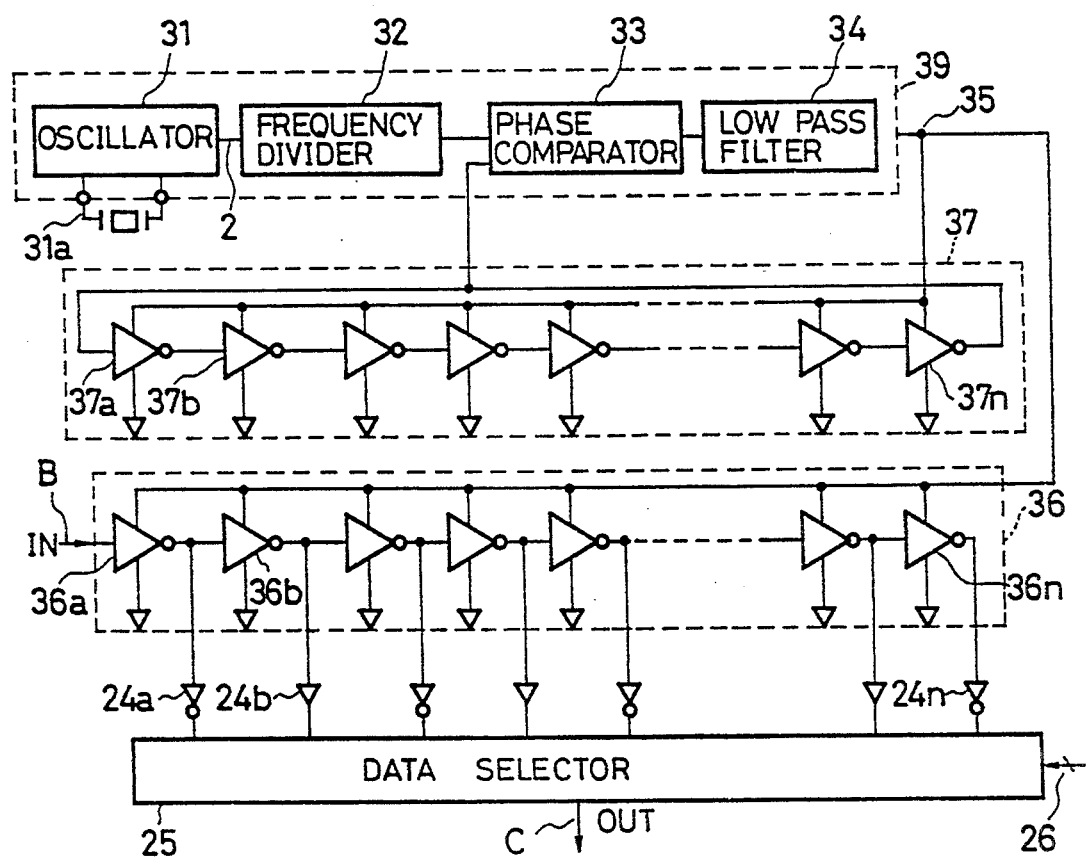
FIG. 1 is a schematic diagram of a delay circuit according to an embodiment of the invention.

In FIG. 1, the delay circuit includes an oscillator 31 for generating a basic clock signal 2 with the aid of an external quartz element 31a, a frequency divider 32 for dividing the frequency of the basic clock signal 2 into a predetermined frequency, a phase comparator 33, and a low pass filter 34 for converting an output of the phase comparator 33 into a control voltage 35. The oscillator 31, the frequency divider 32, the phase comparator 33, and the low pass filter 34 constitute a phase locked lead-in (PLL) circuit 39.

The delay circuit further includes the first inverter array 36 consisting of an odd number of inverters 36a-36n connected in cascade and the second inverter array 37 consisting of the same number of inverters 37a-37n with the same characteristics as those of the inverters 36a-36n connected in cascade, with its output fed back to its input to form a ring counter in addition to the output buffers 24a-24n and the data selector 25.

Figure 3:
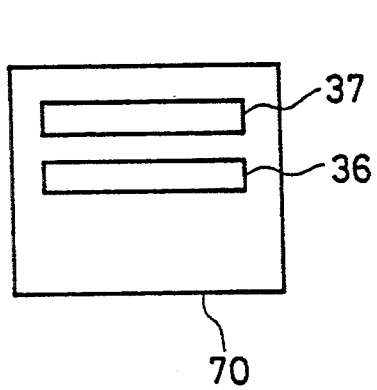
FIG. 3 is a plan view of a part of the delay circuit of FIG. 1.

As shown in FIG. 3, the inverter arrays 36 and 37 are formed on the same chip 70. They are arranged by computer aided design (CAD) with patterns of the same size on the mask.

Figure 4:
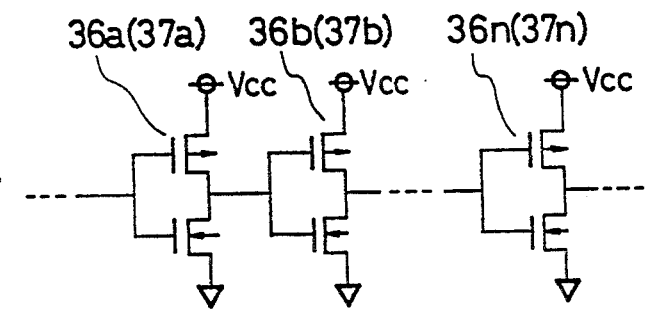
FIG. 4 is a schematic diagram of the chip for the delay circuit of FIG. 1.

As shown in FIG. 4, each of the inverters 36a-36n, 37a-37n is made of p-channel and n-channel complementary metal oxide semiconductors (CMOS's). The inverter is controlled with a threshold voltage equal to a half of the control voltage Vcc so that it is not necessary to provide the inverter with a control or delay transistor, thus making the circuit simple.

In operation, the second inverter array 37 has an odd number of inverters 37a-37n connected in series, with the output of the last-stage inverter 37n fed back to the input of the first-stage inverter 37a to form a ring counter so that it oscillates with a natural frequency. This frequency is an inverse of the sum of delay times on respective stages of the second inverter array 37. This output is compared in the phase comparator 33 with the basic clock signal 2 of a predetermined frequency set by the frequency divider 32. The phase difference is converted into a voltage by the low pass filter 34. This voltage is applied to the second inverter array 37 as a control voltage 35.

Figure 2:
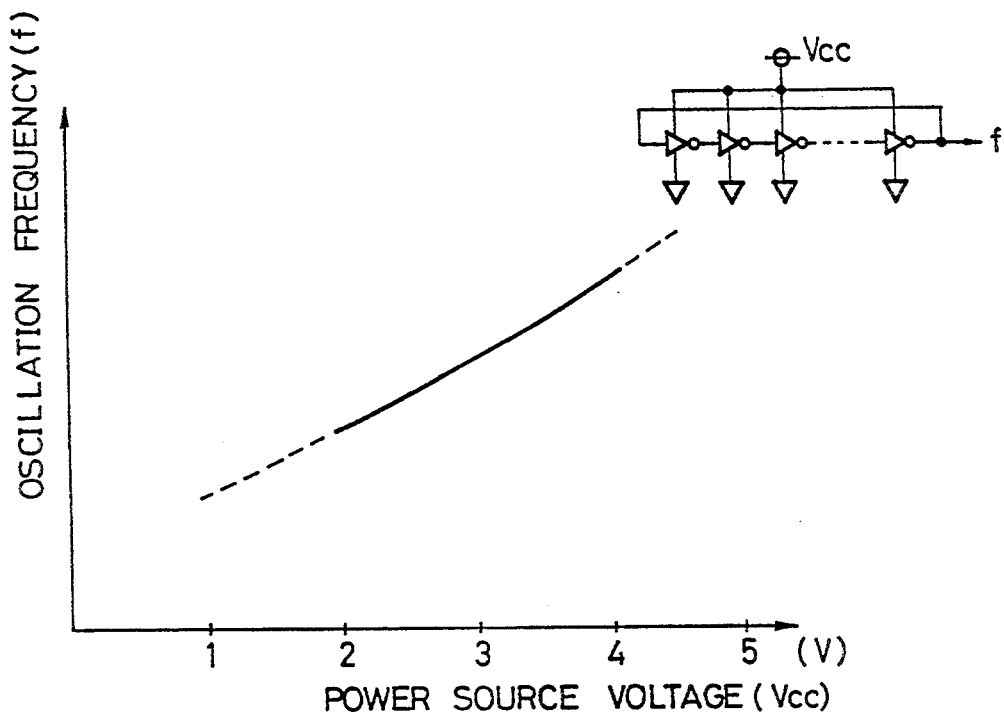
FIG. 2 is a graph showing the parameter characteristics of the delay circuit of FIG. 1.

As shown in FIG. 2, the oscillation frequency (f) of the ring counter increases with the increasing control voltage (Vcc). This makes a phase lock loop to thereby provide a stable oscillation frequency of the ring counter. In other words, when the oscillation frequency drops as the external temperature rises, the phase difference between the basic clock and the oscillation frequency increases. As a result, the control voltage increases, which in turn increases the oscillation frequency. Thus, the oscillation frequency always is controlled to stay within a certain range. That is to say, it is possible to control each delay time of the second inverter array 37 with the accuracy of the oscillator 31.

The control voltage 35 from the PLL circuit 39 also is applied to the first inverter array 36 on the same chip which is identical with the second inverter array 37 in terms of characteristics so that each delay time is controlled with the accuracy substantially equal to that of the oscillator 31. The polarity of the output from the inverter array 36 is uniformed by the buffers 24a-24n. A desired delay signal C is output by the data selector 25 in response to a selection signal 26. In this way, a programmable delay circuit is provided.

Figure 5:
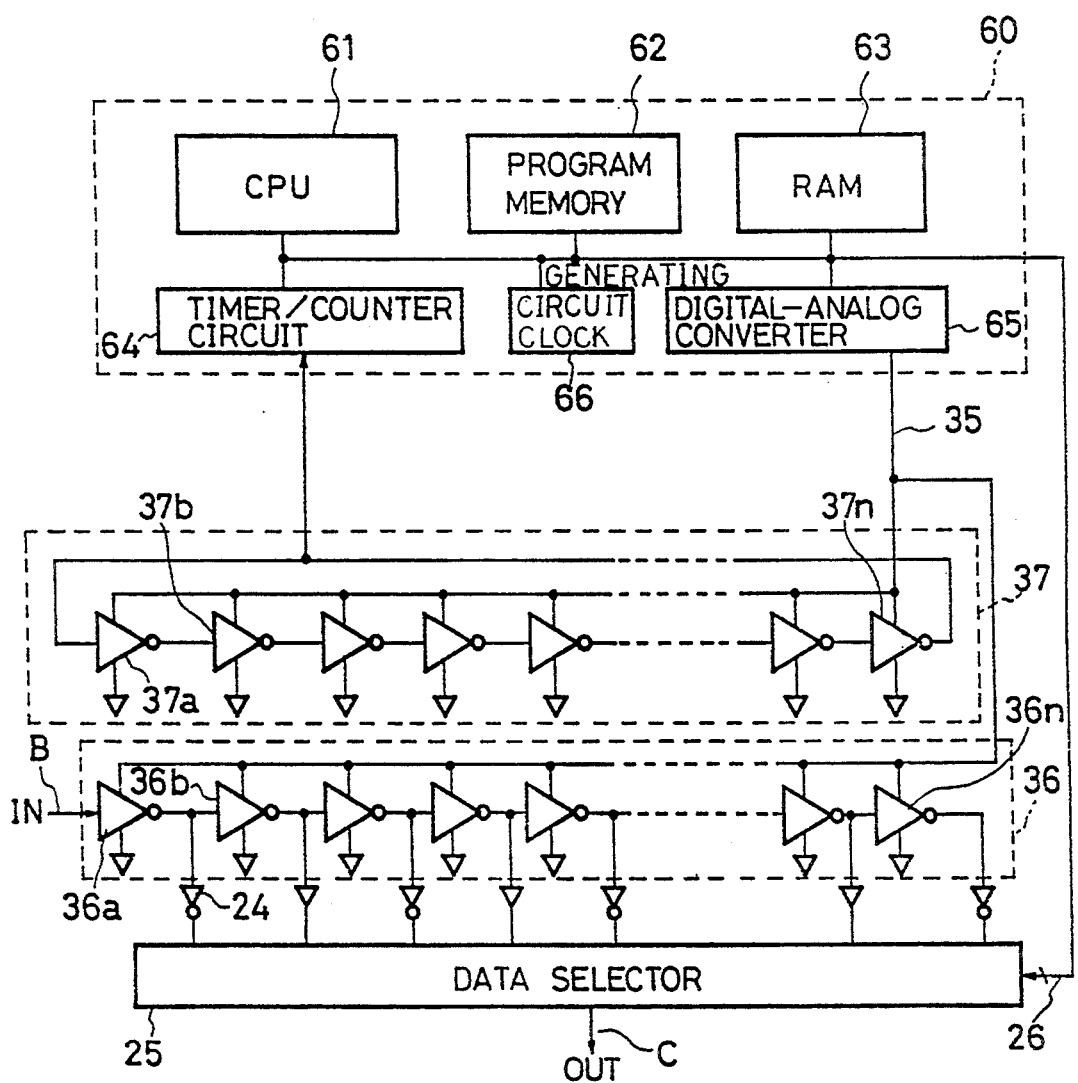
FIG. 5 is a schematic diagram of the delay circuit according to another embodiment of the invention.

Alternatively, the PLL circuit 39, which is made of the oscillator 31, the frequency divider 32, the phase comparator 33, and the low pass filter 34 in the above embodiment, may be made of a microcomputer. Such a delay circuit is shown in FIG. 5. The phase locked lead-in unit or microcomputer 60 includes a central processing unit (CPU) 61, a program memory 62, a data memory (RAM) 63, a timer/counter circuit 64, a digital analog converter 65, and a clock generating circuit 66 to determine the timing of respective units.

Figure 6:
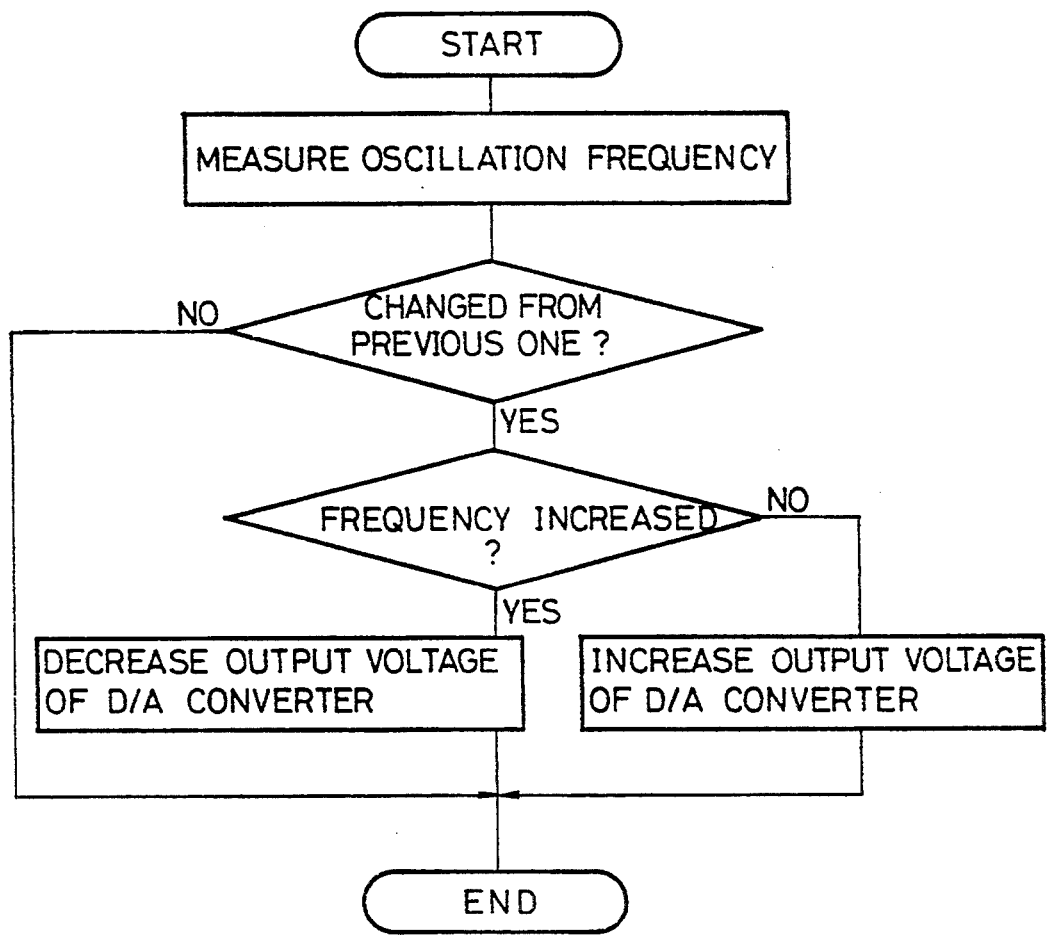
FIG. 6 is a flow chart showing the operation of the delay circuit of FIG. 5.
Figure 7:
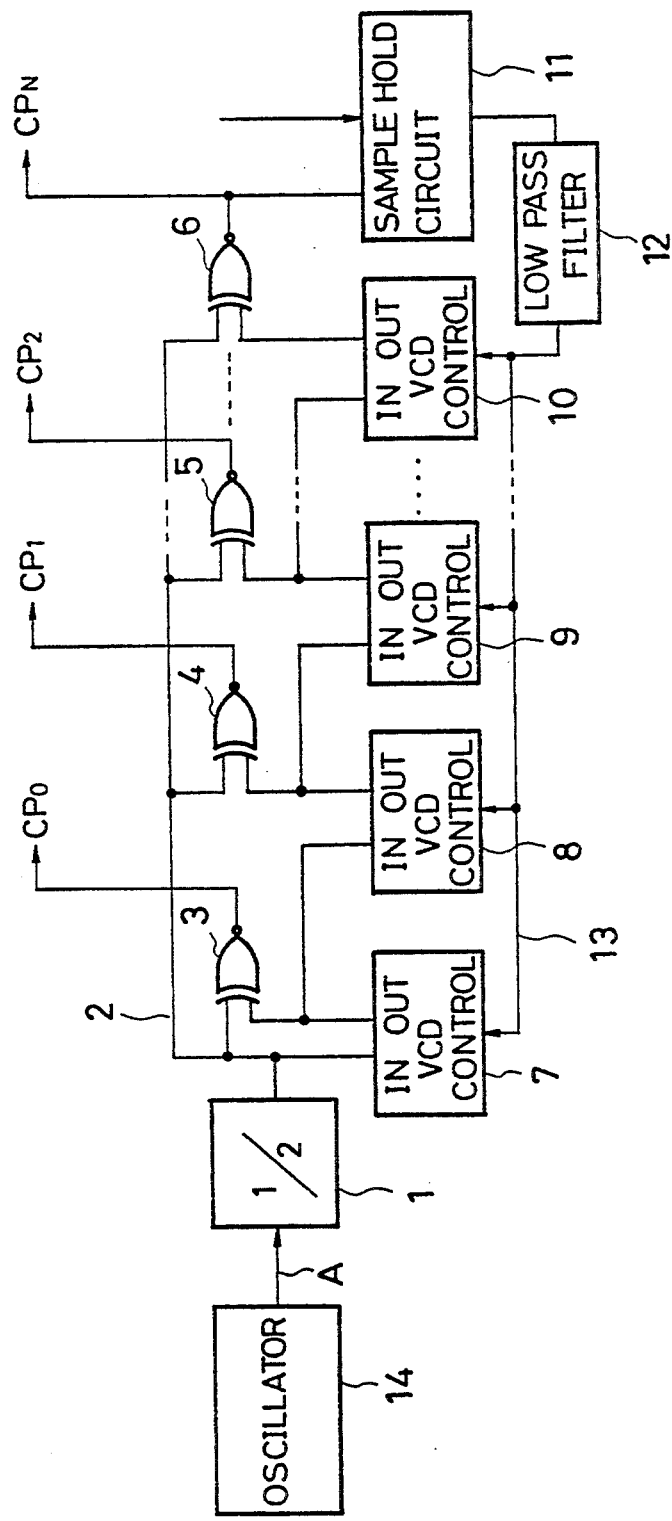
FIGS. 7-9 are schematic diagrams of conventional delay circuits.
Figure 8:
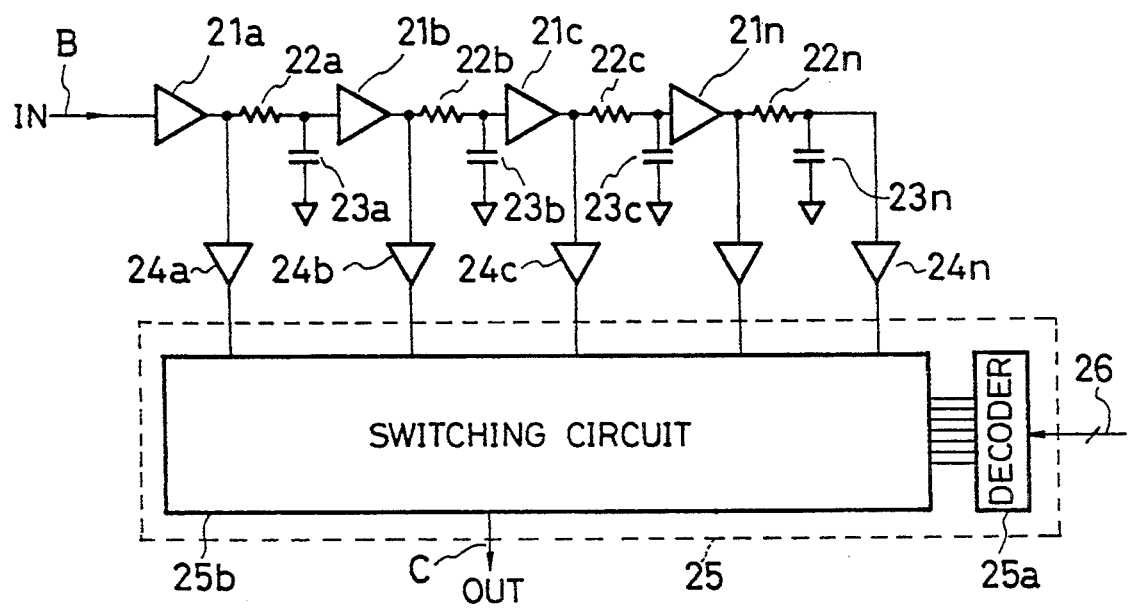
Figure 9:
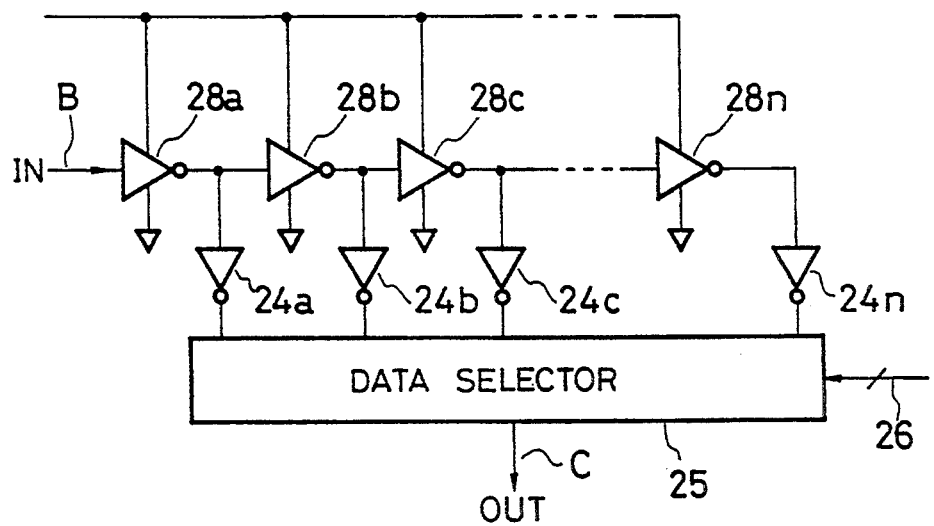

In operation, the CPU 61 controls the control voltage 35 according to the program stored in the program memory 62. The flow chart of this program is shown in FIG. 6. The CPU 61 measures the oscillation frequency of the second inverter array 37 with the timer/counter circuit 64 and compares it with a predetermined value. If the frequency is too high, the control voltage 35 from the digital analog converter 65 is lowered while, if the frequency is too low, the control voltage 35 is raised. By doing this it is possible to produce substantially the same results as those of the above phase locked loop and control the second inverter array 37 with the almost same accuracy as that of the clock generating circuit 66. Similarly, the first inverter array 36 is controlled with high accuracy, thus providing a very accurate delay signal C. The data selector 25 makes a selection in response to a selection signal 26 from the CPU 61.

In the above embodiment, the CMOS inverters are controlled with voltage, but they may be have other configurations and parameters. For example, the oscillation frequency may be corrected by placing the entire circuit in a temperature controlled container and changing the temperature according to the oscillation frequency of the second inverter array 37. Alternatively, the quantity of light may be used to control the oscillation frequency.

As has been described above, the delay circuit includes a semiconductor chip; a first inverter array formed on the semiconductor ship so as to have an odd number of first inverters connected in series so that it provides a delay signal at an output of each first inverter; a data selector for selecting a signal from the delay signals output at the first inverters; a second inverter array formed on the semiconductor ship so as to have second inverters, each having the same configuration as that of the first inverters, which are connected to form a ring counter; and a phase locked lead-in unit for determining a phase difference between an oscillation output of the second inverter array and a basic clock and converting it into a voltage which is applied to the first and second inverter arrays, wherein the natural oscillation of the second inverter array ring counter always is compared with the basic oscillation to provide a stable and accurate delay signal against voltage and temperature changes, with no or little adjustment required for the finished integrated circuit, thus providing the increased productivity.

What is claimed is:

1. A delay circuit comprising:

a first inverter array as a delay means and a second inverter array as a detection means for voltage and other environmental changes, both provided on a semiconductor ship, wherein the inverter arrays have almost the same structure; the first inverter array (36) is constructed by connecting a first CMOS inverter (36a) for receiving a signal (B) and second to N-th CMOS inverters in series with a signal output of a previous CMOS inverter being directly connected to a signal input of a subsequent CMOS inverter by a signal line without a control transistor or a delay transistor interposed therebetween, and comprises a power voltage input terminal for receiving a power voltage for each of the CMOS inverters and a plurality of tap output lines connected to the respective signal outputs of the CMOS inverters; and the second inverter array (37) is constructed by connecting first to N-th CMOS inverters in series with a signal output of the n-th CMOS inverter being fed back to a signal input of the first CMOS inverter to constitute a ring counter which oscillates itself at a specific frequency and a signal output of a previous CMOS inverter being directly connected to a signal input of a subsequent CMOS inverter by a signal line without a control transistor or a delay transistor interposed therebetween, and comprises a power voltage input terminal for receiving a power voltage for each of the CMOS inverters;

a data selector comprising input terminals connected to the respective tap output lines of the first inverter array, a select signal input terminal and a data output terminal, and responsive to a select signal to take out a desired delay time by selecting and outputting an output signal of a particular CMOS inverter of the first inverter array; and a phase-locked lead-in means comprising a power voltage output terminal connected to the power voltage input terminals of the first and second inverter arrays and a signal input terminal for receiving an output signal of the N-th CMOS inverter of the second inverter array, for controlling a power voltage to be provided to the power voltage input terminals of the first and second inverter arrays based on the phase difference obtained by comparing the output signal inputted through the signal input terminal and a basic clock signal generated by a built-in oscillation means, wherein the ring counter which is constructed by the second inverter array and controlled by the phase-locked lead-in means is caused to oscillate by itself at a frequency synchronized with the basic clock signal by a power voltage supplied to the power voltage input terminals of the first and second inverter arrays; and the output signal of each of the CMOS inverters of the first inverter array is output as a signal indicating an accurate delay time synchronized with the basic clock signal.

2. The delay circuit of claim 1, wherein said phase locked lead-in means comprises:

said oscillation means for generating said basic clock signal;

a frequency divider for dividing a frequency of said basic clock signal into a predetermined frequency;

a phase comparator for comparing said output signal of said second inverter array with said basic clock signal; and a low pass filter for converting an output of said phase comparator into said power voltage output.

3. The delay circuit of claim 1, wherein said phase locked lead-in means includes a microcomputer which comprises:

a central processing unit for executing a program and issuing instructions responsive to said oscillation frequency from said second inverter array;

a digital analog converter responsive to an instruction from said central processing unit to control said power voltage output; and a timer counter circuit, coupled to said central processing unit, for measuring said oscillation frequency from said second inverter array.

4. The delay circuit of claim 1, wherein said first and second inverter arrays are formed on said semiconductor chip with patterns of the same size.

* * * * *